(12) United States Patent
Choi et al.

(10) Patent No.: US 10,573,361 B2
(45) Date of Patent: Feb. 25, 2020

(54) SEMICONDUCTOR DEVICE

(71) Applicant: SK hynix Inc., Icheon-si, Gyeonggi-do (KR)

(72) Inventors: Geun Ho Choi, Icheon-si (KR); Han Kyu Chi, Seoul (KR); Min Su Park, Seoul (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 16/210,506

(22) Filed: Dec. 5, 2018

(65) Prior Publication Data

US 2019/0333553 A1    Oct. 31, 2019

(30) Foreign Application Priority Data

Apr. 27, 2018  (KR) .......................... 10-2018-0048998

(51) Int. Cl.
*G11C 7/22* (2006.01)
*G11C 7/10* (2006.01)

(52) U.S. Cl.
CPC ............ *G11C 7/222* (2013.01); *G11C 7/1039* (2013.01); *G11C 7/1051* (2013.01); *G11C 7/1066* (2013.01); *G11C 7/1093* (2013.01); *G11C 7/22* (2013.01)

(58) Field of Classification Search
CPC ......... G11C 7/222; G11C 7/22; G11C 7/1051; G11C 7/1066
USPC .................................... 365/189.15, 191, 194
See application file for complete search history.

(56) References Cited

U.S. PATENT DOCUMENTS 10,014,042 B2 *   7/2018   Hong .................... G11C 7/1072

FOREIGN PATENT DOCUMENTS

| KR | 100510512 B1 | 8/2005 |
|---|---|---|
| KR | 1020130050095 A | 5/2013 |

* cited by examiner

*Primary Examiner* — Son L Mai
(74) *Attorney, Agent, or Firm* — William Park & Associates Ltd.

(57) ABSTRACT

A semiconductor device includes a control circuit configured to generate a data reset signal which is enabled in response to a reset signal and first and second transfer control signals which are sequentially enabled in synchronization with a divided clock in response to a read signal and a trigger circuit configured to drive a driving signal depending on a logic level of latch data in synchronization with delayed clocks in response to the first and second transfer control signals, the driving signal having a fixed logic level based on the data reset signal being enabled.

22 Claims, 11 Drawing Sheets

SEMICONDUCTOR DEVICE

CROSS-REFERENCE TO RELATED APPLICATION

The present application claims priority under 35 U.S.C. § 119(a) to Korean Patent Application No. 10-2018-0048998 filed on Apr. 27, 2018 in the Korean Intellectual Property Office, which is incorporated herein by reference in its entirety.

BACKGROUND

1. Technical Field

Embodiments of the present disclosure relate to a semiconductor device configured to output data in synchronization with divided clock signals.

2. Related Art

Recently, as the operating speed of a semiconductor system increases, a high data transfer rate is being required among the semiconductor devices included in the semiconductor system. In order to satisfy a high data transfer rate or a high bandwidth for data to be inputted and outputted (inputted/outputted) in series among semiconductor devices, prefetch is applied. Prefetch means to latch and deserialize the data inputted in series. In order to deserialize data, a clock dividing method is used. As a clock is divided, multi-phase clock signals having different phases are generated, and serialization or deserialization of data is controlled by using the multi-phase clock signals.

SUMMARY

In an embodiment, a semiconductor device may include: a control circuit configured to generate a data reset signal which is enabled in response to a reset signal and first and second transfer control signals which are sequentially enabled in synchronization with a divided clock in response to a read signal; and a trigger circuit configured to drive a driving signal depending on a logic level of latch data in synchronization with delayed clocks in response to the first and second transfer control signals, the driving signal having a fixed logic level based on the data reset signal being enabled.

In an embodiment, a semiconductor device may include: a control circuit configured to generate first to fourth data reset signals which are enabled in response to a reset signal and first to eighth transfer control signals which are sequentially enabled in synchronization with first to fourth divided clocks in response to a read signal; a pipe latch circuit configured to latch first to eighth global data in response to first to fourth input control signals, and generate first to fourth latch data from the latched first to eighth global data in response to first to fourth output control signals; and a trigger circuit configured to drive a driving signal depending on logic levels of the first to fourth latch data in synchronization with first to fourth delayed clocks in response to the first to eighth transfer control signals, the driving signal having a fixed logic level based on the first to fourth data reset signals being enabled.

DETAILED DESCRIPTION

Hereinafter, a semiconductor device will be described below with reference to the accompanying drawings through various examples of embodiments.

Various embodiments may be directed to a semiconductor device which outputs output data in synchronization with divided clocks (.e., divided clock signals) having different phases and drives output data to a fixed logic level during a period excluding a data output period.

According to the embodiments, output data may be outputted in synchronization with divided clocks having different phases and may be driven to a fixed logic level during a period excluding a data output period, whereby it may be possible to prevent an output data generation error from occurring, even though a divided clock is generated.

Figure 1:
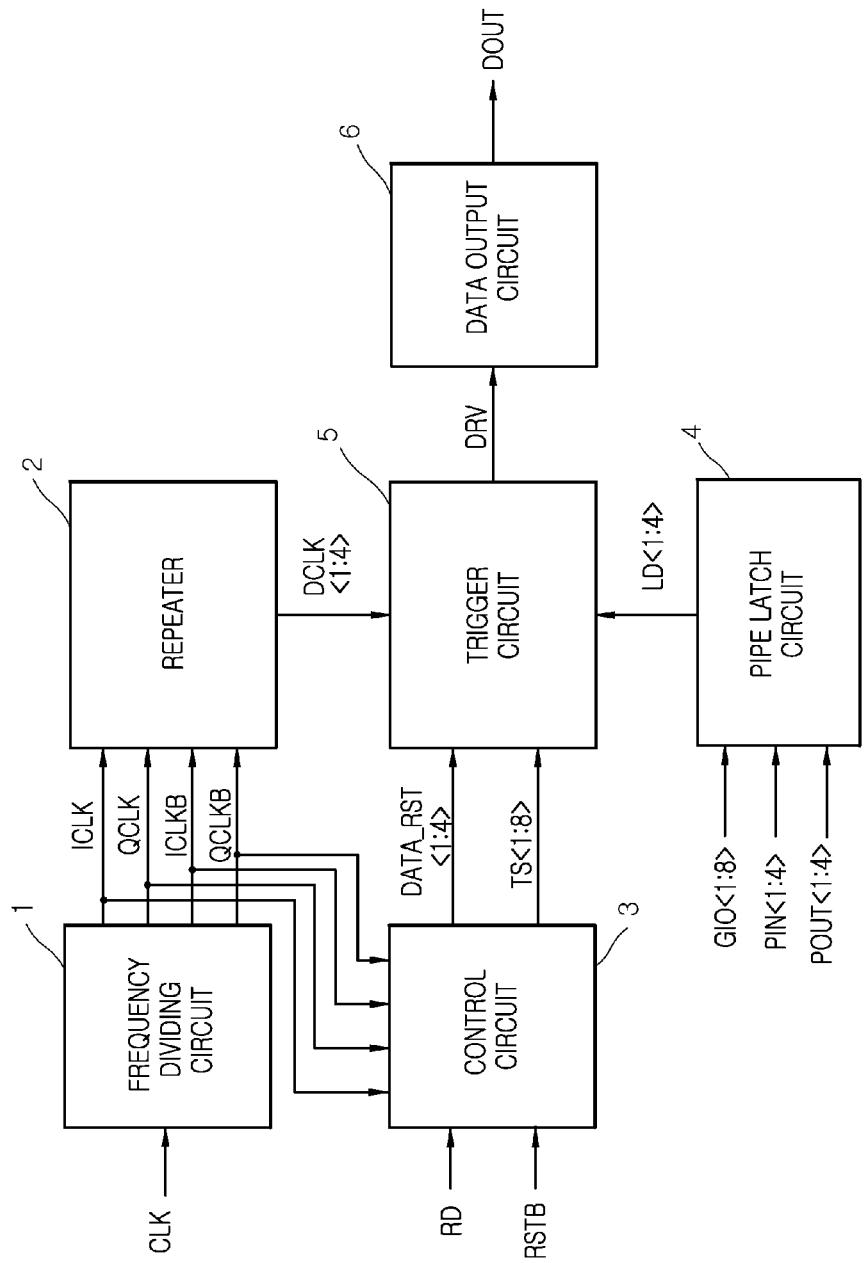
FIG. 1 is a block diagram illustrating a representation of an example of the configuration of a semiconductor device in accordance with an embodiment.

As illustrated in FIG. 1, a semiconductor device in accordance with an embodiment may include a frequency dividing circuit 1, a repeater 2, a control circuit 3, a pipe latch circuit 4, a trigger circuit 5 and a data output circuit 6.

Figure 11:
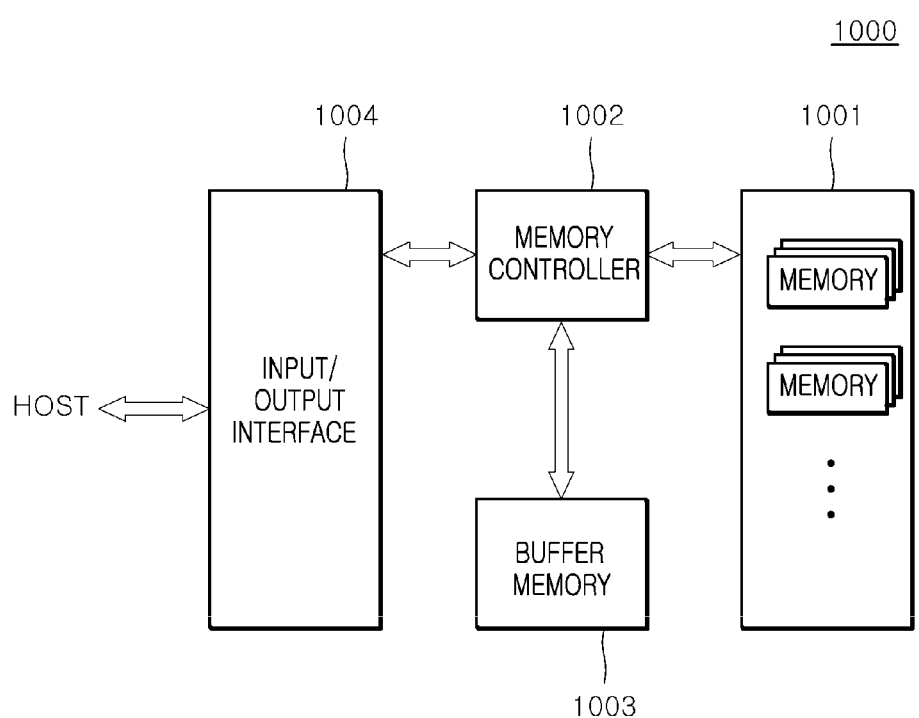
FIG. 11 is a diagram illustrating a representation of an example of the configuration of an electronic system to which the semiconductor device illustrated in FIGS. 1 to 10 is applied.

The frequency dividing circuit 1 may generate a first divided clock ICLK (signal), a second divided clock QCLK (signal), a third divided clock ICLKB (signal) and a fourth divided clock QCLKB (signal) in response to a clock CLK (signal). The frequency dividing circuit 1 may generate the first divided clock ICLK, the second divided clock QCLK, the third divided clock ICLKB and the fourth divided clock QCLKB which have a frequency two times higher than the frequency of the clock CLK. The clock CLK may be set as a signal which is inputted from an outside and cyclically toggles to synchronize the operation of the semiconductor device. In some embodiments, the clock CLK may be received externally from the semiconductor device by the semiconductor device. In some embodiments, the clock CLK may be received by a memory controller (i.e., FIG. 11, 1002). In other embodiments, the clock CLK may be received by a host (i.e., FIG. 11, HOST), an input/output interface (i.e., 1004), and or data storage (i.e., 1001), etc. In still other embodiments, the clock CLK may be received externally from the frequency dividing circuit 1. The first divided clock ICLK, the second divided clock QCLK, the third divided clock ICLKB and the fourth divided clock QCLKB may be set to have different phases. The frequency dividing circuit 1 may be realized by a general frequency dividing circuit including a phase-locked loop (PLL) or a delay-locked loop (DLL). While the frequency dividing circuit 1 is realized to generate the first divided clock ICLK, the second divided clock QCLK, the third divided clock ICLKB and the fourth divided clock QCLKB in response to the clock CLK, it is to be noted that the present disclosure is not limited thereto and the frequency dividing circuit 1 may be realized to generate various numbers of divided clocks depending on an embodiment.

The repeater 2 may delay the first divided clock ICLK, the second divided clock QCLK, the third divided clock ICLKB and the fourth divided clock QCLKB by a predetermined period, and may generate a first delayed clock DCLK<1>, a second delayed clock DCLK<2>, a third delayed clock DCLK<3> and a fourth delayed clock DCLK<4>. The repeater 2 may be realized by a delay circuit of which delay amount is adjusted depending on the internal delay amount of the semiconductor device.

The word "predetermined" as used herein with respect to a parameter, such as a predetermined period, means that a value for the parameter is determined prior to the parameter being used in a process or algorithm. For some embodiments, the value for the parameter is determined before the process or algorithm begins. In other embodiments, the value for the parameter is determined during the process or algorithm but before the parameter is used in the process or algorithm.

The control circuit 3 may generate first to fourth data reset signals DATA_RST<1:4> which are enabled in response to a reset signal RSTB. The control circuit 3 may generate first to eighth transfer control signals TS<1:8> which are sequentially enabled in synchronization with the first divided clock ICLK, the second divided clock QCLK, the third divided clock ICLKB and the fourth divided clock QCLKB in response to a read signal RD. The control circuit 3 may generate the first transfer control signal TS<1> and the second transfer control signal TS<2> which are sequentially enabled in synchronization with the second divided clock QCLK in response to the read signal RD. The control circuit 3 may generate the third transfer control signal TS<3> and the fourth transfer control signal TS<4> which are sequentially enabled in synchronization with the third divided clock ICLKB in response to the read signal RD. The control circuit 3 may generate the fifth transfer control signal TS<5> and the sixth transfer control signal TS<6> which are sequentially enabled in synchronization with the fourth divided clock QCLKB in response to the read signal RD. The control circuit 3 may generate the seventh transfer control signal TS<7> and the eighth transfer control signal TS<8> which are sequentially enabled in synchronization with the first divided clock ICLK in response to the read signal RD. The reset signal RSTB may be set as a signal which is enabled to a logic low level in an initializing operation for the semiconductor device to perform an operation. The read signal RD may be set as a signal which is enabled in a read operation of outputting first to eighth global data GIO<1:8> as output data DOUT.

The pipe latch circuit 4 may latch the first to eighth global data GIO<1:8> in response to the first to fourth input control signals PIN<1:4>. The pipe latch circuit 4 may latch the first global data GIO<1> and the second global data GIO<2> in response to the first input control signal PIN<1>. The pipe latch circuit 4 may latch the third global data GIO<3> and the fourth global data GIO<4> in response to the second input control signal PIN<2>. The pipe latch circuit 4 may latch the fifth global data GIO<5> and the sixth global data GIO<6> in response to the third input control signal PIN<3>. The pipe latch circuit 4 may latch the seventh global data GIO<7> and the eighth global data GIO<8> in response to the fourth input control signal PIN<4>. The first to fourth input control signals PIN<1:4> may be set as signals which are enabled to latch data in a plurality of pipe latches in a read operation. The first to fourth input control signals PIN<1:4> may be set as signals which are sequentially enabled.

The pipe latch circuit 4 may generate first to fourth latch data LD<1:4> from the latched first to eighth global data GIO<1:8> in response to first to fourth output control signals POUT<1:4>. The pipe latch circuit 4 may generate the first to fourth latch data LD<1:4> by performing an alignment operation for the latched first to eighth global data GIO<1:8>. The pipe latch circuit 4 may generate the first latch data LD<1> from the latched first global data GIO<1> and fifth global data GIO<5> in response to the first output control signal POUT<1>. The pipe latch circuit 4 may output the latched first global data GIO<1> as the first bit of the first latch data LD<1> in response to the first output control signal POUT<1>. The pipe latch circuit 4 may output the latched fifth global data GIO<5> as the second bit of the first latch data LD<1> in response to the first output control signal POUT<1>. The pipe latch circuit 4 may generate the second latch data LD<2> from the latched second global data GIO<2> and sixth global data GIO<6> in response to the second output control signal POUT<2>. The pipe latch circuit 4 may output the latched second global data GIO<2> as the first bit of the second latch data LD<2> in response to the second output control signal POUT<2>. The pipe latch circuit 4 may output the latched sixth global data GIO<6> as the second bit of the second latch data LD<2> in response to the second output control signal POUT<2>. The pipe latch circuit 4 may generate the third latch data LD<3> from the latched third global data GIO<3> and seventh global data GIO<7> in response to the third output control signal POUT<3>. The pipe latch circuit 4 may output the latched third global data GIO<3> as the first bit of the third latch data LD<3> in response to the third output control signal POUT<3>. The pipe latch circuit 4 may output the latched seventh global data GIO<7> as the second bit of the third latch data LD<3> in response to the third output control signal POUT<3>. The pipe latch circuit 4 may generate the fourth latch data LD<4> from the latched fourth global data GIO<4> and eighth global data GIO<8> in response to the fourth output control signal POUT<4>. The pipe latch circuit 4 may output the latched fourth global data GIO<4> as the first bit of the fourth latch data LD<4> in response to the fourth output control signal POUT<4>. The pipe latch circuit 4 may output the latched eighth global data GIO<8> as the second bit of the fourth latch data LD<4> in response to the fourth output control signal POUT<4>. The first to fourth output control signals POUT<1:4> may be set as signals which are enabled to output data latched in a plurality of pipe latches in a read operation. The first to fourth output control signals POUT<1:4> may be set as signals which are sequentially enabled. The pipe latch circuit 4 may be realized by using a plurality of general pipe latches.

The trigger circuit 5 may drive a driving signal DRV depending on the logic levels of the first to fourth latch data LD<1:4> in synchronization with the first to fourth delayed clocks DCLK<1:4> in response to the first to eighth transfer control signals TS<1:8>. The trigger circuit 5 may drive the driving signal DRV depending on the logic level of the first latch data LD<1> in synchronization with the rising edges of the first to fourth delayed clocks DCLK<1:4> in response to the first and second transfer control signals TS<1:2>. The trigger circuit 5 may drive the driving signal DRV depending on the logic level of the second latch data LD<2> in synchronization with the rising edges of the first to fourth delayed clocks DCLK<1:4> in response to the third and fourth transfer control signals TS<3:4>. The trigger circuit 5 may drive the driving signal DRV depending on the logic level of the third latch data LD<3> in synchronization with the rising edges of the first to fourth delayed clocks DCLK<1:4> in response to the fifth and sixth transfer control signals TS<5:6>. The trigger circuit 5 may drive the driving signal DRV depending on the logic level of the fourth latch data LD<4> in synchronization with the rising edges of the first to fourth delayed clocks DCLK<1:4> in response to the seventh and eighth transfer control signals TS<7:8>. The trigger circuit 5 may generate the driving signal DRV having a fixed logic level in response to the first to fourth data reset signals DATA_RST<1:4>. The fixed logic level of the driving signal DRV may be set as a logic high level or a logic low level.

The data output circuit 6 may drive output data DOUT in response to the driving signal DRV. The data output circuit 6 may generate the output data DOUT depending on the logic level of the driving signal DRV. The data output circuit 6 may output the output data DOUT to an outside. The data output circuit 6 may be realized by a general buffer circuit. In some embodiments, the output data DOUT may be output to an outside of the semiconductor device. In some embodiments, the output data DOUT may be output to a memory controller (i.e., FIG. 11, 1002). In other embodiments, the output data DOUT may be output to a host (i.e., FIG. 11, HOST), an input/output interface (i.e., 1004), and or throughout the data storage (i.e., 1001), etc. In still other embodiments, the output data DOUT may be output to an outside of the data output circuit 6.

Figure 2:
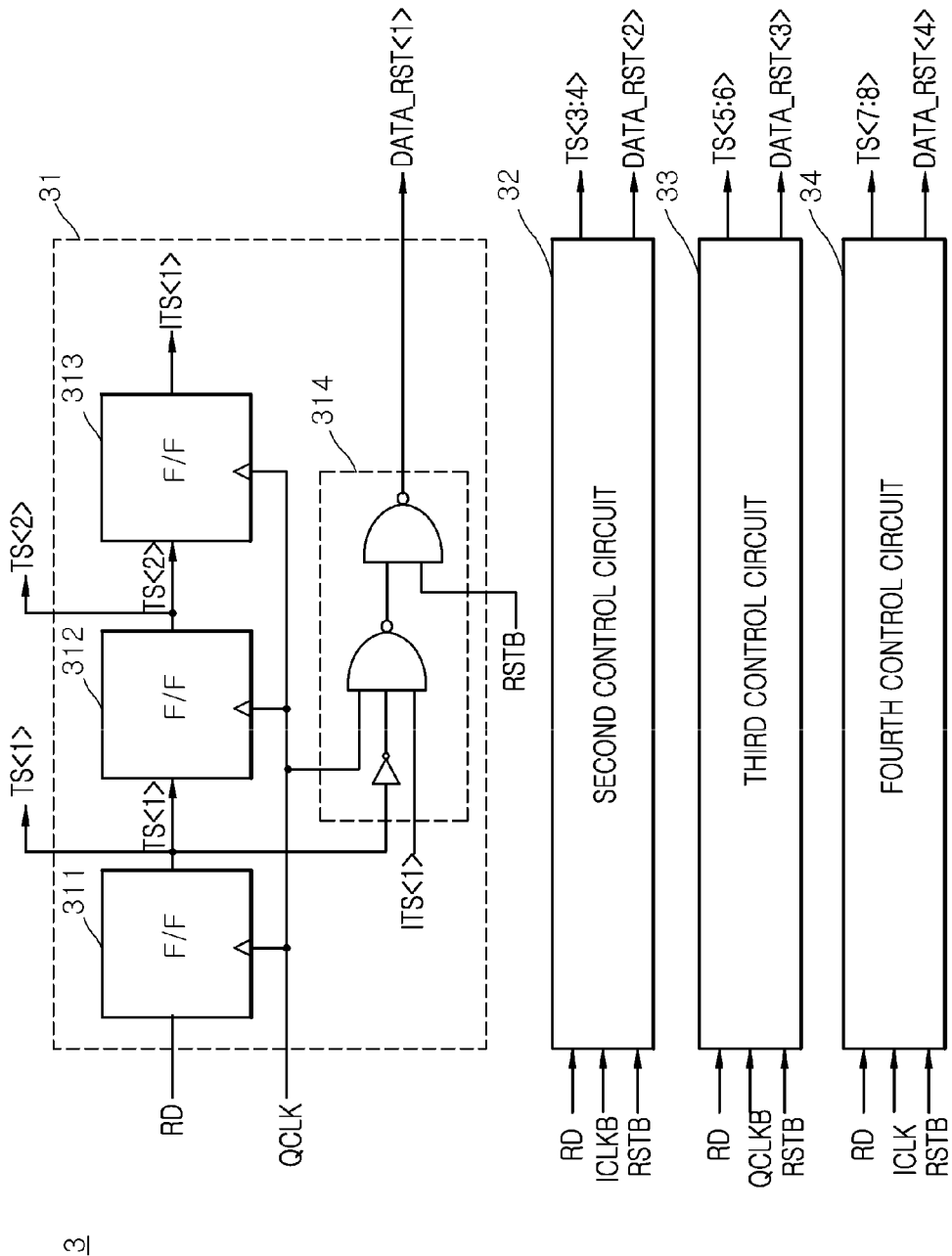
FIG. 2 is a diagram illustrating a representation of an example of the configuration of the control circuit included in the semiconductor device illustrated in FIG. 1.

Referring to FIG. 2, the control circuit 3 may include a first control circuit 31, a second control circuit 32, a third control circuit 33 and a fourth control circuit 34.

The first control circuit 31 may generate the first data reset signal DATA_RST<1> which is enabled in response to the reset signal RSTB. The first control circuit 31 may generate the first and second transfer control signals TS<1:2> which are sequentially enabled in synchronization with the second divided clock QCLK in response to the read signal RD.

The second control circuit 32 may generate the second data reset signal DATA_RST<2> which is enabled in response to the reset signal RSTB. The second control circuit 32 may generate the third and fourth transfer control signals TS<3:4> which are sequentially enabled in synchronization with the third divided clock ICLKB in response to the read signal RD.

The third control circuit 33 may generate the third data reset signal DATA_RST<3> which is enabled in response to the reset signal RSTB. The third control circuit 33 may generate the fifth and sixth transfer control signals TS<5:6> which are sequentially enabled in synchronization with the fourth divided clock QCLKB in response to the read signal RD.

The fourth control circuit 34 may generate the fourth data reset signal DATA_RST<4> which is enabled in response to the reset signal RSTB. The fourth control circuit 34 may generate the seventh and eighth transfer control signals TS<7:8> which are sequentially enabled in synchronization with the first divided clock ICLK in response to the read signal RD.

For example, the first control circuit 31 may include a first flip-flop 311, a second flip-flop 312, a third flip-flop 313 and a data reset signal generation circuit 314.

The first flip-flop 311 may latch the read signal RD in synchronization with the rising edge of the second divided clock QCLK and output the latched read signal RD as the first transfer control signal TS<1>.

The second flip-flop 312 may latch the first transfer control signal TS<1> in synchronization with the rising edge of the second divided clock QCLK and output the latched first transfer control signal TS<1> as the second transfer control signal TS<2>.

The third flip-flop 313 may latch the second transfer control signal TS<2> in synchronization with the rising edge of the second divided clock QCLK and output the latched second transfer control signal TS<2> as an internal transfer control signal ITS<1>.

The data reset signal generation circuit 314 may generate the first data reset signal DATA_RST<1> which is enabled in response to the reset signal RSTB. The data reset signal generation circuit 314 may generate the first data reset signal DATA_RST<1> which is enabled in response to the internal transfer control signal ITS<1>. The data reset signal generation circuit 314 may generate the first data reset signal DATA_RST<1> which is disabled, by blocking the input of the internal transfer control signal ITS<1> in the case where the first transfer control signal TS<1> is a first logic level (a logic high level) in synchronization with the rising edge of the second divided clock QCLK, in a successive read operation. Furthermore, the configuration of a logic gate or logic gates, for the data reset signal generation circuits, required for implementing the same function or operation may be modified differently from, for example, what is illustrated in FIG. 2. That is, the logic gate configuration of one type of operation and another logic gate configuration for the same type of operation may be replaced with each other, depending on a specific situation. If necessary, various logic gates may be applied to implement the configurations.

Meanwhile, since the second control circuit 32, the third control circuit 33 and the fourth control circuit 34 illustrated in FIG. 2 are realized by the same circuit and perform the same operation as the first control circuit 31 with the exception that only input/output signals are different, descriptions thereof will be omitted herein.

Figure 3:
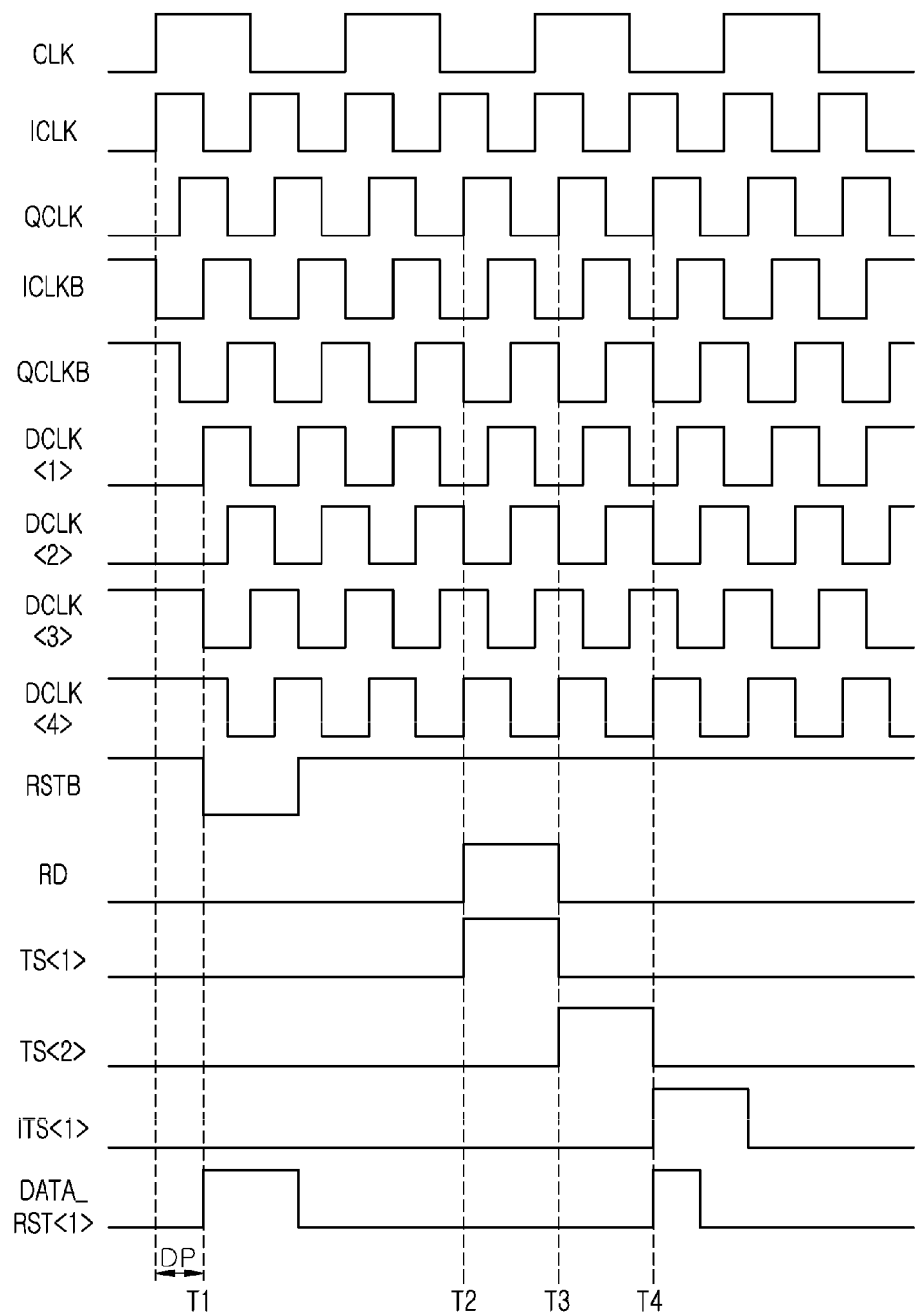
FIG. 3 is a representation of an example of a timing diagram to assist in the explanation of the operations of the frequency dividing circuit and the repeater illustrated in FIG. 1 and the operation of the first control circuit included in the control circuit illustrated in FIG. 2.

The operations of the frequency dividing circuit 1 and the repeater 2 and the operation of the control circuit 3 will be described hereunder with reference to FIG. 3, by taking as an example an operation of generating the first and second transfer control signals TS<1:2> and the first data reset signal DATA_RST<1> in the first control circuit 31.

The frequency dividing circuit 1 generates the first divided clock ICLK, the second divided clock QCLK, the third divided clock ICLKB and the fourth divided clock QCLKB in response to the clock CLK. The first divided clock ICLK, the second divided clock QCLK, the third divided clock ICLKB and the fourth divided clock QCLKB are generated to have a frequency two times higher than the frequency of the clock CLK. The first divided clock ICLK, the second divided clock QCLK, the third divided clock ICLKB and the fourth divided clock QCLKB are generated to have a phase difference of 90 degrees.

The repeater 2 delays the first divided clock ICLK, the second divided clock QCLK, the third divided clock ICLKB and the fourth divided clock QCLKB by an internal delay amount DP, and generates the first delayed clock DCLK<1>, the second delayed clock DCLK<2>, the third delayed clock DCLK<3> and the fourth delayed clock DCLK<4>.

At a time T1, the data reset signal generation circuit 314 of the first control circuit 31 generates the first data reset signal DATA_RST<1> which is enabled to a logic high level, in response to the reset signal RSTB which is enabled to the logic low level.

At a time T2, the first flip-flop 311 of the first control circuit 31 latches the read signal RD in synchronization with the rising edge of the second divided clock QCLK, and outputs the latched read signal RD as the first transfer control signal TS<1>.

At a time T3, the second flip-flop 312 of the first control circuit 31 latches the first transfer control signal TS<1> in synchronization with the rising edge of the second divided clock QCLK, and outputs the latched first transfer control signal TS<1> as the second transfer control signal TS<2>.

At a time T4, the third flip-flop 313 of the first control circuit 31 latches the second transfer control signal TS<2> in synchronization with the rising edge of the second divided clock QCLK, and outputs the latched second transfer control signal TS<2> as the internal transfer control signal ITS<1>.

The data reset signal generation circuit 314 of the first control circuit 31 generates the first data reset signal DATA_RST<1> which is enabled to the logic high level, in synchronization with the rising edge of the second divided clock QCLK in response to the internal transfer control signal ITS<1> of a logic high level.

Meanwhile, in the case where the read signal RD is inputted at a logic high level at the time T4 in a successive read operation, the first transfer control signal TS<1> is generated at the logic high level, but the data reset signal generation circuit 314 blocks the input of the internal transfer control signal ITS<1> and generates the first data reset signal DATA_RST<1> which is disabled to a logic low level.

Figure 4:
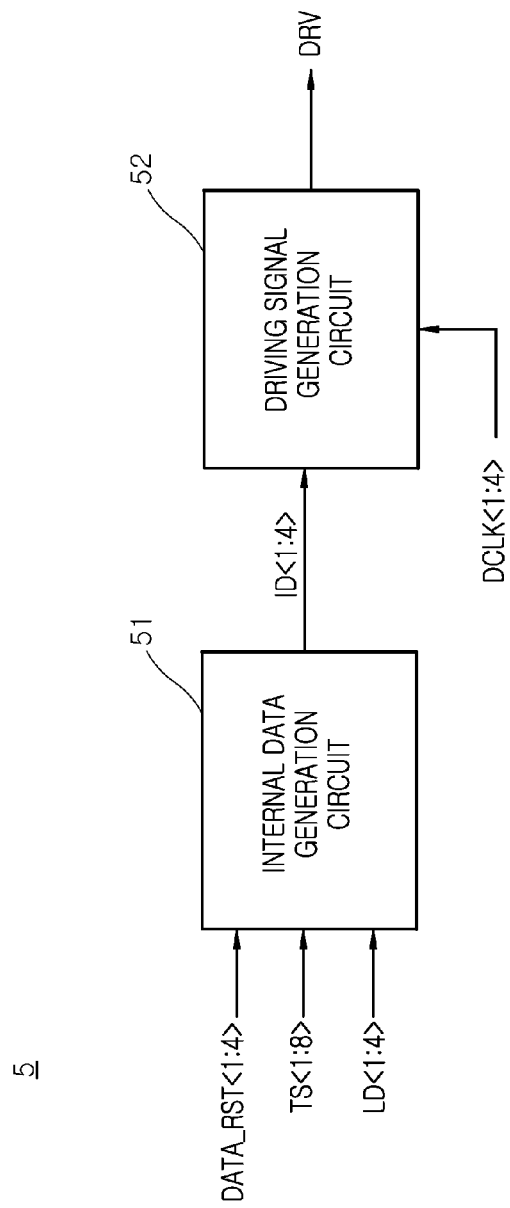
FIG. 4 is a block diagram illustrating a representation of an example of the configuration of the trigger circuit included in the semiconductor device illustrated in FIG. 1.

Referring to FIG. 4, the trigger circuit 5 may include an internal data generation circuit 51 and a driving signal generation circuit 52.

The internal data generation circuit 51 may generate first to fourth internal data ID<1:4> which have a fixed logic level, in response to the first to fourth data reset signals DATA_RST<1:4>. The internal data generation circuit 51 may generate the first internal data ID<1> which is fixed to a logic high level, in the case where the first data reset signal DATA_RST<1> is enabled to the logic high level. The internal data generation circuit 51 may generate the second internal data ID<2> which is fixed to a logic high level, in the case where the second data reset signal DATA_RST<2> is enabled to a logic high level. The internal data generation circuit 51 may generate the third internal data ID<3> which is fixed to a logic high level, in the case where the third data reset signal DATA_RST<3> is enabled to a logic high level. The internal data generation circuit 51 may generate the fourth internal data ID<4> which is fixed to a logic high level, in the case where the fourth data reset signal DATA_RST<4> is enabled to a logic high level.

The internal data generation circuit 51 may buffer the first to fourth latch data LD<1:4> in response to the first to eighth transfer control signals TS<1:8> and thereby generate the first to fourth internal data ID<1:4>. The internal data generation circuit 51 may buffer the first latch data LD<1> in response to the first and second transfer control signals TS<1:2> and thereby generate the first internal data ID<1>. The internal data generation circuit 51 may buffer the second latch data LD<2> in response to the third and fourth transfer control signals TS<3:4> and thereby generate the second internal data ID<2>. The internal data generation circuit 51 may buffer the third latch data LD<3> in response to the fifth and sixth transfer control signals TS<5:6> and thereby generate the third internal data ID<3>. The internal data generation circuit 51 may buffer the fourth latch data LD<4> in response to the seventh and eighth transfer control signals TS<7:8> and thereby generate the fourth internal data ID<4>.

The driving signal generation circuit 52 may generate the driving signal DRV depending on the logic levels of the first to fourth internal data ID<1:4> in synchronization with the first to fourth delayed clocks DCLK<1:4>.

Figure 5:
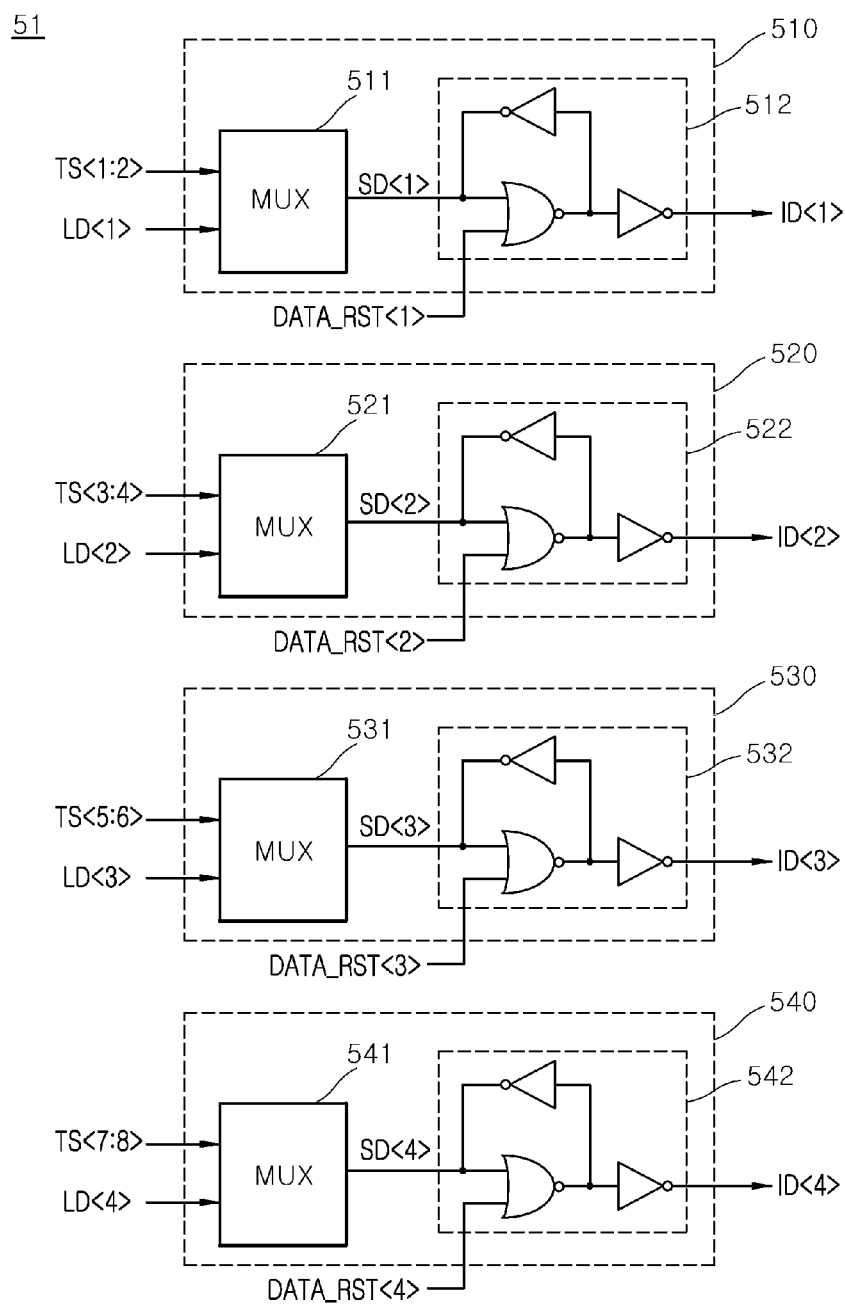
FIG. 5 is a circuit diagram illustrating a representation of an example of the configuration of the internal data generation circuit included in the trigger circuit illustrated in FIG. 4.

Referring to FIG. 5, the internal data generation circuit 51 may include a first internal data generation circuit 510, a second internal data generation circuit 520, a third internal data generation circuit 530 and a fourth internal data generation circuit 540. Furthermore, the configuration of a logic gate or logic gates, for the internal data generation circuits, required for implementing the same function or operation may be modified differently from, for example, what is illustrated in FIG. 5. That is, the logic gate configuration of one type of operation and another logic gate configuration for the same type of operation may be replaced with each other, depending on a specific situation. If necessary, various logic gates may be applied to implement the configurations.

The first internal data generation circuit 510 may include a first selective transfer circuit 511 and a first logic circuit 512. The first selective transfer circuit 511 may output the first bit included in the first latch data LD<1> as first selection data SD<1> in response to the first transfer control signal TS<1>. The first selective transfer circuit 511 may output the second bit included in the first latch data LD<1> as the first selection data SD<1> in response to the second transfer control signal TS<2>. The first logic circuit 512 may generate the first internal data ID<1> which is fixed to the logic high level, in the case where the first data reset signal DATA_RST<1> is enabled to the logic high level. The first logic circuit 512 may generate the first internal data ID<1> by buffering the first selection data SD<1>, in the case where the first data reset signal DATA_RST<1> is disabled to the logic low level. The first logic circuit 512 may store the first selection data SD<1> in the case where the first data reset signal DATA_RST<1> is disabled to the logic low level.

That is to say, the first internal data generation circuit 510 may generate the first internal data ID<1> which is fixed to the logic high level, in the case where the first data reset signal DATA_RST<1> is enabled. The first internal data generation circuit 510 may generate the first internal data ID<1> by buffering the first latch data LD<1> in response to the first and second transfer control signals TS<1:2>, in the case where the first data reset signal DATA_RST<1> is disabled.

The second internal data generation circuit 520 may include a second selective transfer circuit 521 and a second logic circuit 522. The second selective transfer circuit 521 may output the first bit included in the second latch data LD<2> as second selection data SD<2> in response to the third transfer control signal TS<3>. The second selective transfer circuit 521 may output the second bit included in the second latch data LD<2> as the second selection data SD<2> in response to the fourth transfer control signal TS<4>. The second logic circuit 522 may generate the second internal data ID<2> which is fixed to the logic high level, in the case where the second data reset signal DATA_RST<2> is enabled to the logic high level. The second logic circuit 522 may generate the second internal data ID<2> by buffering the second selection data SD<2>, in the case where the second data reset signal DATA_RST<2> is disabled to a logic low level. The second logic circuit 522 may store the second selection data SD<2> in the case where the second data reset signal DATA_RST<2> is disabled to the logic low level.

That is to say, the second internal data generation circuit 520 may generate the second internal data ID<2> which is fixed to the logic high level, in the case where the second data reset signal DATA_RST<2> is enabled. The second internal data generation circuit 520 may generate the second internal data ID<2> by buffering the second latch data LD<2> in response to the third and fourth transfer control signals TS<3:4>, in the case where the second data reset signal DATA_RST<2> is disabled.

The third internal data generation circuit 530 may include a third selective transfer circuit 531 and a third logic circuit 532. The third selective transfer circuit 531 may output the first bit included in the third latch data LD<3> as third selection data SD<3> in response to the fifth transfer control signal TS<5>. The third selective transfer circuit 531 may output the second bit included in the third latch data LD<3> as the third selection data SD<3> in response to the sixth transfer control signal TS<6>. The third logic circuit 532 may generate the third internal data ID<3> which is fixed to the logic high level, in the case where the third data reset signal DATA_RST<3> is enabled to the logic high level. The third logic circuit 532 may generate the third internal data ID<3> by buffering the third selection data SD<3>, in the case where the third data reset signal DATA_RST<3> is disabled to a logic low level. The third logic circuit 532 may store the third selection data SD<3> in the case where the third data reset signal DATA_RST<3> is disabled to the logic low level.

That is to say, the third internal data generation circuit 530 may generate the third internal data ID<3> which is fixed to the logic high level, in the case where the third data reset signal DATA_RST<3> is enabled. The third internal data generation circuit 530 may generate the third internal data ID<3> by buffering the third latch data LD<3> in response to the fifth and sixth transfer control signals TS<5:6>, in the case where the third data reset signal DATA_RST<3> is disabled.

The fourth internal data generation circuit 540 may include a fourth selective transfer circuit 541 and a fourth logic circuit 542. The fourth selective transfer circuit 541 may output the first bit included in the fourth latch data LD<4> as fourth selection data SD<4> in response to the seventh transfer control signal TS<7>. The fourth selective transfer circuit 541 may output the second bit included in the fourth latch data LD<4> as the fourth selection data SD<4> in response to the eighth transfer control signal TS<8>. The fourth logic circuit 542 may generate the fourth internal data ID<4> which is fixed to the logic high level, in the case where the fourth data reset signal DATA_RST<4> is enabled to the logic high level. The fourth logic circuit 542 may generate the fourth internal data ID<4> by buffering the fourth selection data SD<4>, in the case where the fourth data reset signal DATA_RST<4> is disabled to a logic low level. The fourth logic circuit 542 may store the fourth selection data SD<4> in the case where the fourth data reset signal DATA_RST<4> is disabled to the logic low level.

That is to say, the fourth internal data generation circuit 540 may generate the fourth internal data ID<4> which is fixed to the logic high level, in the case where the fourth data reset signal DATA_RST<4> is enabled. The fourth internal data generation circuit 540 may generate the fourth internal data ID<4> by buffering the fourth latch data LD<4> in response to the seventh and eighth transfer control signals TS<7:8>, in the case where the fourth data reset signal DATA_RST<4> is disabled.

The operation of the internal data generation circuit 51 as an operation of generating the first to fourth internal data ID<1:4> depending on the logic levels of the first to fourth data reset signals DATA_RST<1:4> will be described hereunder with reference to FIG. 6.

At a time T11, in an initializing operation, the first internal data generation circuit 510 generates the first internal data ID<1> which is fixed to the logic high level, in response to the first data reset signal DATA_RST<1> which is enabled to the logic high level. The second internal data generation circuit 520 generates the second internal data ID<2> which is fixed to the logic high level, in response to the second data reset signal DATA_RST<2> which is enabled to the logic high level. The third internal data generation circuit 530 generates the third internal data ID<3> which is fixed to the logic high level, in response to the third data reset signal DATA_RST<3> which is enabled to the logic high level. The fourth internal data generation circuit 540 generates the fourth internal data ID<4> which is fixed to the logic high level, in response to the fourth data reset signal DATA_RST<4> which is enabled to the logic high level. The time T11 is set to be the same time as the time T1 described above with reference to FIG. 3.

At a time T12, in a read operation, the first internal data generation circuit 510 buffers the first bit of the first latch data LD<1> in response to the first transfer control signal TS<1> and generates the first internal data ID<1>, since the first data reset signal DATA_RST<1> is disabled to the logic low level. The time T12 is set to be the same time as the time T2 described above with reference to FIG. 3.

At a time T13, the second internal data generation circuit 520 buffers the first bit of the second latch data LD<2> in response to the third transfer control signal TS<3> and generates the second internal data ID<2>, since the second data reset signal DATA_RST<2> is disabled to the logic low level.

At a time T14, the third internal data generation circuit 530 buffers the first bit of the third latch data LD<3> in response to the fifth transfer control signal TS<5> and generates the third internal data ID<3>, since the third data reset signal DATA_RST<3> is disabled to the logic low level.

The first internal data generation circuit 510 buffers the second bit of the first latch data LD<1> in response to the second transfer control signal TS<2> and generates the first internal data ID<1>, since the first data reset signal DATA_RST<1> is disabled to the logic low level. The time T14 is set to be the same time as the time T3 described above with reference to FIG. 3.

At a time T15, the fourth internal data generation circuit 540 buffers the first bit of the fourth latch data LD<4> in response to the seventh transfer control signal TS<7> and generates the fourth internal data ID<4>, since the fourth data reset signal DATA_RST<4> is disabled to the logic low level.

The second internal data generation circuit 520 buffers the second bit of the second latch data LD<2> in response to the fourth transfer control signal TS<4> and generates the second internal data ID<2>, since the second data reset signal DATA_RST<2> is disabled to the logic low level.

At a time T16, the first internal data generation circuit 510 generates the first internal data ID<1> which is fixed to the logic high level, in response to the first data reset signal DATA_RST<1> which is enabled to the logic high level.

The third internal data generation circuit 530 buffers the second bit of the third latch data LD<3> in response to the sixth transfer control signal TS<6> and generates the third internal data ID<3>, since the third data reset signal DATA_RST<3> is disabled to the logic low level. The time T16 is set to be the same time as the time T4 described above with reference to FIG. 3.

At a time T17, the second internal data generation circuit 520 generates the second internal data ID<2> which is fixed to the logic high level, in response to the second data reset signal DATA_RST<2> which is enabled to the logic high level.

The fourth internal data generation circuit 540 buffers the second bit of the fourth latch data LD<4> in response to the eighth transfer control signal TS<8> and generates the fourth internal data ID<4>, since the fourth data reset signal DATA_RST<4> is disabled to the logic low level.

At a time T18, the third internal data generation circuit 530 generates the third internal data ID<3> which is fixed to the logic high level, in response to the third data reset signal DATA_RST<3> which is enabled to the logic high level.

At a time T19, the fourth internal data generation circuit 540 generates the fourth internal data ID<4> which is fixed to the logic high level, in response to the fourth data reset signal DATA_RST<4> which is enabled to the logic high level.

Figure 6:
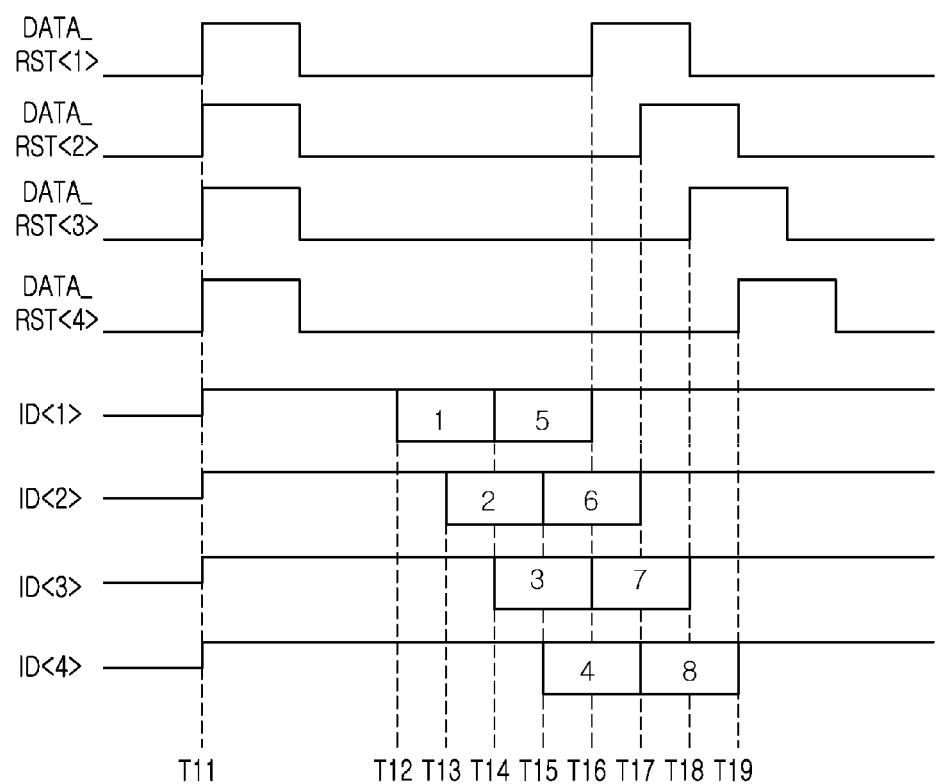
FIG. 6 is a representation of an example of a timing diagram to assist in the explanation of the operation of the internal data generation circuit included in the trigger circuit illustrated in FIG. 5.

Meanwhile, the natural numbers 1, 2, 3, 4, 5, 6, 7 and 8 illustrated in FIG. 6 mean the bits generated from the first to eighth global data GIO<1:8>. For example, the first bit of the first internal data ID<1> illustrated by the natural number 1 means that it is generated from the first bit of the first latch data LD<1> generated through the first global data GIO<1>. The second bit of the first internal data ID<1> illustrated by the natural number 5 means that it is generated from the second bit of the first latch data LD<1> generated through the fifth global data GIO<5>. Hereinbelow, the natural numbers 1, 2, 3, 4, 5, 6, 7 and 8 illustrated in a figure mean the bits generated from the first to eighth global data GIO<1:8>.

The internal data generation circuit 51 as described above may generate the first to fourth internal data ID<1:4> which are fixed to the logic high levels, in response to the reset signal RSTB in the initializing operation. The internal data generation circuit 51 generates the first to fourth internal data ID<1:4> from the first to fourth latch data LD<1:4> in response to the first to eighth transfer control signals TS<1:8> in the read operation. The internal data generation circuit 51 may generate the first to fourth internal data ID<1:4> which are fixed to the logic high levels by the first to fourth data reset signals DATA_RST<1:4>, after the first to fourth internal data ID<1:4> are generated.

Figure 7:
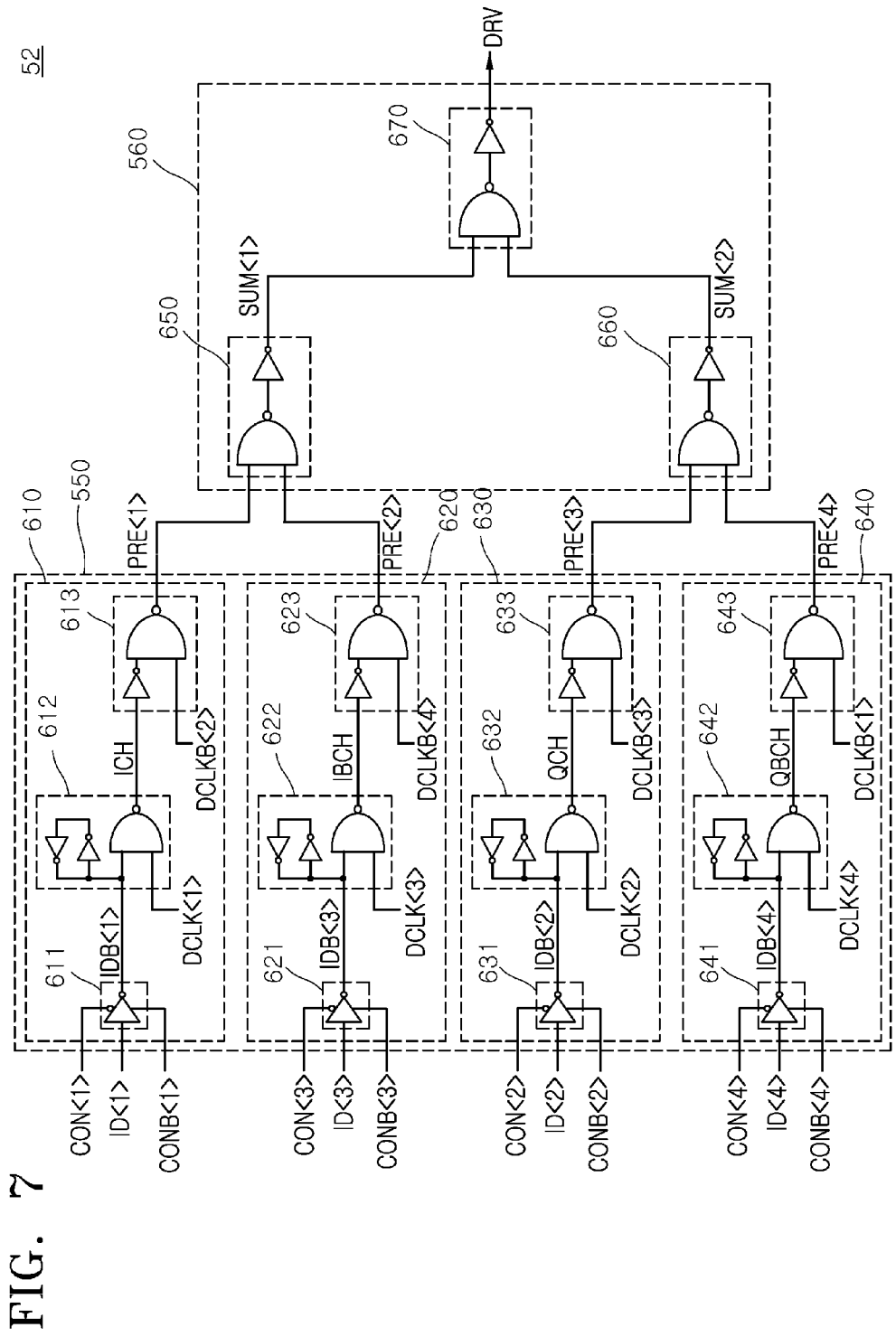
FIG. 7 is a circuit diagram illustrating a representation of an example of the configuration of the driving signal generation circuit included in the trigger circuit illustrated in FIG. 4.

Referring to FIG. 7, the driving signal generation circuit 52 may include a pre-signal generation circuit 550 and a signal summing circuit 560.

The pre-signal generation circuit 550 may include a first pre-signal generation circuit 610, a second pre-signal generation circuit 620, a third pre-signal generation circuit 630 and a fourth pre-signal generation circuit 640. Furthermore, the configuration of a logic gate or logic gates, for the pre-signal generation circuits and signal summing circuit, required for implementing the same function or operation may be modified differently from, for example, what is illustrated in FIG. 7. That is, the logic gate configuration of one type of operation and another logic gate configuration for the same type of operation may be replaced with each other, depending on a specific situation. If necessary, various logic gates may be applied to implement the configurations.

The first pre-signal generation circuit 610 may include a first buffer circuit 611, a second buffer circuit 612 and a third buffer circuit 613. The first buffer circuit 611 may invert and buffer the first internal data ID<1> and generate first inverted internal data IDB<1> in the case where a first control signal CON<1> is a logic low level and a first inverted control signal CONB<1> is a logic high level. The second buffer circuit 612 may invert and buffer the first inverted internal data IDB<1> and generate a first chop signal ICH during a period in which the first delayed clock DCLK<1> is a logic high level. The second buffer circuit 612 may store the first inverted internal data IDB<1>. The third buffer circuit 613 may buffer the first chop signal ICH and generate a first pre-signal PRE<1> during a period in which a second inverted delayed clock DCLKB<2> is a logic high level. The first control signal CON<1> is a signal which is enabled to the logic low level at a time when the first delayed clock DCLK<1> is generated. The first inverted control signal CONB<1> is an inverted signal of the first control signal CON<1>. The second inverted delayed clock DCLKB<2> is an inverted signal of the second delayed clock DCLK<2>.

In other words, the first pre-signal generation circuit 610 may receive the first internal data ID<1> during a period in which the first control signal CON<1> is the logic low level. The first pre-signal generation circuit 610 may generate the first pre-signal PRE<1> which is driven depending on the logic level of the first internal data ID<1>, during a period in which the first delayed clock DCLK<1> is the logic high level and the second delayed clock DCLK<2> is a logic low level.

The second pre-signal generation circuit 620 may include a fourth buffer circuit 621, a fifth buffer circuit 622 and a sixth buffer circuit 623. The fourth buffer circuit 621 may invert and buffer the third internal data ID<3> and generate third inverted internal data IDB<3> in the case where a third control signal CON<3> is a logic low level and a third inverted control signal CONB<3> is a logic high level. The fifth buffer circuit 622 may invert and buffer the third inverted internal data IDB<3> and generate a second chop signal IBCH during a period in which the third delayed clock DCLK<3> is a logic high level. The fifth buffer circuit 622 may store the third inverted internal data IDB<3>. The sixth buffer circuit 623 may buffer the second chop signal IBCH and generate a second pre-signal PRE<2> during a period in which a fourth inverted delayed clock DCLKB<4> is a logic high level. The third control signal CON<3> is a signal which is enabled to the logic low level at a time when the third delayed clock DCLK<3> is generated. The third inverted control signal CONB<3> is an inverted signal of the third control signal CON<3>. The fourth inverted delayed clock DCLKB<4> is an inverted signal of the fourth delayed clock DCLK<4>.

In other words, the second pre-signal generation circuit 620 may receive the third internal data ID<3> during a period in which the third control signal CON<3> is the logic low level. The second pre-signal generation circuit 620 may generate the second pre-signal PRE<2> which is driven depending on the logic level of the third internal data ID<3>, during a period in which the third delayed clock DCLK<3> is the logic high level and the fourth delayed clock DCLK<4> is a logic low level.

The third pre-signal generation circuit 630 may include a seventh buffer circuit 631, an eighth buffer circuit 632 and a ninth buffer circuit 633. The seventh buffer circuit 631 may invert and buffer the second internal data ID<2> and generate second inverted internal data IDB<2> in the case where a second control signal CON<2> is a logic low level and a second inverted control signal CONB<2> is a logic high level. The eighth buffer circuit 632 may invert and buffer the second inverted internal data IDB<2> and generate a third chop signal QCH during a period in which the second delayed clock DCLK<2> is a logic high level. The eighth buffer circuit 632 may store the second inverted internal data IDB<2>. The ninth buffer circuit 633 may buffer the third chop signal QCH and generate a third pre-signal PRE<3> during a period in which a third inverted delayed clock DCLKB<3> is a logic high level. The second control signal CON<2> is a signal which is enabled to the logic low level at a time when the second delayed clock DCLK<2> is generated. The second inverted control signal CONB<2> is an inverted signal of the second control signal CON<2>. The third inverted delayed clock DCLKB<3> is an inverted signal of the third delayed clock DCLK<3>.

In other words, the third pre-signal generation circuit 630 may receive the second internal data ID<2> during a period in which the second control signal CON<2> is the logic low level. The third pre-signal generation circuit 630 may generate the third pre-signal PRE<3> which is driven depending on the logic level of the second internal data ID<2>, during a period in which the second delayed clock DCLK<2> is the logic high level and the third delayed clock DCLK<3> is a logic low level.

The fourth pre-signal generation circuit 640 may include a tenth buffer circuit 641, an eleventh buffer circuit 642 and a twelfth buffer circuit 643. The tenth buffer circuit 641 may invert and buffer the fourth internal data ID<4> and generate fourth inverted internal data IDB<4> in the case where a fourth control signal CON<4> is a logic low level and a fourth inverted control signal CONB<4> is a logic high level. The eleventh buffer circuit 642 may invert and buffer the fourth inverted internal data IDB<4> and generate a fourth chop signal QBCH during a period in which the fourth delayed clock DCLK<4> is a logic high level. The eleventh buffer circuit 642 may store the fourth inverted internal data IDB<4>. The twelfth buffer circuit 643 may buffer the fourth chop signal QBCH and generate a fourth pre-signal PRE<4> during a period in which a first inverted delayed clock DCLKB<1> is a logic high level. The fourth control signal CON<4> is a signal which is enabled to the logic low level at a time when the fourth delayed clock DCLK<4> is generated. The fourth inverted control signal CONB<4> is an inverted signal of the fourth control signal CON<4>. The first inverted delayed clock DCLKB<1> is an inverted signal of the first delayed clock DCLK<1>.

In other words, the fourth pre-signal generation circuit 640 may receive the fourth internal data ID<4> during a period in which the fourth control signal CON<4> is the logic low level. The fourth pre-signal generation circuit 640 may generate the fourth pre-signal PRE<4> which is driven depending on the logic level of the fourth internal data ID<4>, during a period in which the fourth delayed clock DCLK<4> is the logic high level and the first delayed clock DCLK<1> is a logic low level.

The signal summing circuit 560 may include a first signal summing circuit 650, a second signal summing circuit 660 and a third signal summing circuit 670.

The first signal summing circuit 650 may sum the first pre-signal PRE<1> and the second pre-signal PRE<2> and generate a first summed signal SUM<1>. The first signal summing circuit 650 may generate the first summed signal SUM<1> by performing an AND logic operation on the first pre-signal PRE<1> and the second pre-signal PRE<2>.

The second signal summing circuit 660 may sum the third pre-signal PRE<3> and the fourth pre-signal PRE<4> and generate a second summed signal SUM<2>. The second signal summing circuit 660 may generate the second summed signal SUM<2> by performing an AND logic operation on the third pre-signal PRE<3> and the fourth pre-signal PRE<4>.

The third signal summing circuit 670 may sum the first summed signal SUM<1> and the second summed signal SUM<2> and generate the driving signal DRV. The third signal summing circuit 670 may generate the driving signal DRV by performing an AND logic operation on the first summed signal SUM<1> and the second summed signal SUM<2>.

Figure 8:
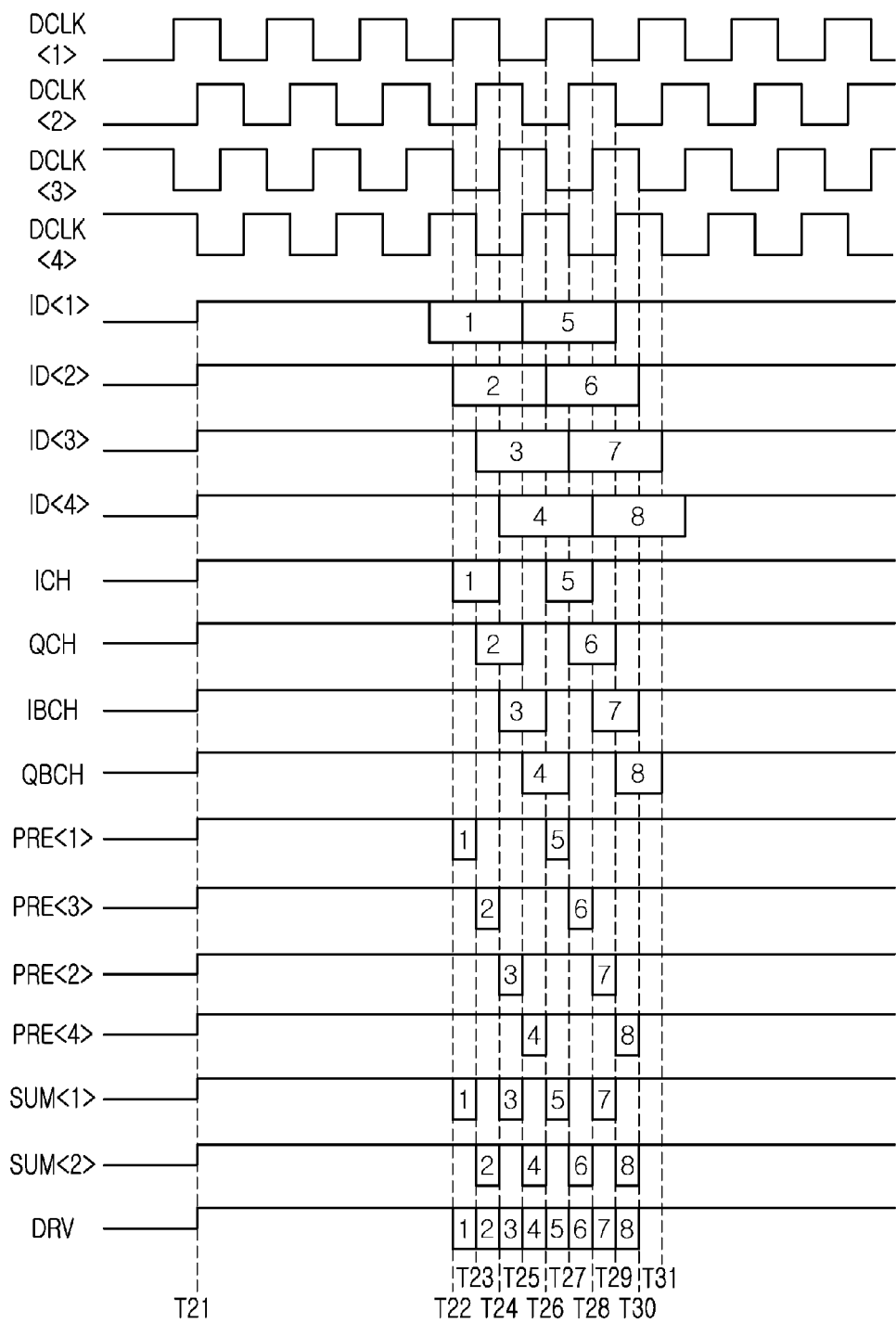
FIG. 8 is a representation of an example of a timing diagram to assist in the explanation of the operation of the driving signal generation circuit included in the trigger circuit illustrated in FIG. 7.

The operation of the driving signal generation circuit 52 as an operation of generating the driving signal DRV from the first to fourth internal data ID<1:4> in synchronization with the first to fourth delayed clocks DCLK<1:4> will be described hereunder with reference to FIG. 8.

First, an initializing operation and an operation of receiving the first to fourth internal data ID<1:4> will be described below.

At a time T21, in the initializing operation, the first to fourth internal data ID<1:4> are generated at logic levels which are fixed to the logic high levels. The time T21 is set to be the same time as the time T1 described above with reference to FIG. 3.

The first buffer circuit 611 of the first pre-signal generation circuit 610 receives the first internal data ID<1> in response to the first control signal CON<1>. The fourth buffer circuit 621 of the second pre-signal generation circuit 620 receives the third internal data ID<3> in response to the third control signal CON<3>. The seventh buffer circuit 631 of the third pre-signal generation circuit 630 receives the second internal data ID<2> in response to the second control signal CON<2>. The tenth buffer circuit 641 of the fourth pre-signal generation circuit 640 receives the fourth internal data ID<4> in response to the fourth control signal CON<4>.

Next, an operation of generating the first chop signal ICH, the second chop signal IBCH, the third chop signal QCH and the fourth chop signal QBCH in synchronization with the first to fourth delayed clocks DCLK<1:4> in the pre-signal generation circuit 550 in a read operation after the initializing operation will be described below.

In the read operation during a period T22 to T24, the second buffer circuit 612 of the first pre-signal generation circuit 610 inverts and buffers the first inverted internal data IDB<1> and generates the first chop signal ICH since the first delayed clock DCLK<1> is the logic high level. At this time, the first chop signal ICH is generated from the first global data GIO<1>.

In the read operation during a period T23 to T25, the eighth buffer circuit 632 of the third pre-signal generation circuit 630 inverts and buffers the second inverted internal data IDB<2> and generates the third chop signal QCH since the second delayed clock DCLK<2> is the logic high level. At this time, the third chop signal QCH is generated from the second global data GIO<2>.

In the read operation during a period T24 to T26, the fifth buffer circuit 622 of the second pre-signal generation circuit 620 inverts and buffers the third inverted internal data IDB<3> and generates the second chop signal IBCH since the third delayed clock DCLK<3> is the logic high level. At this time, the second chop signal IBCH is generated from the third global data GIO<3>.

In the read operation during a period T25 to T27, the eleventh buffer circuit 642 of the fourth pre-signal generation circuit 640 inverts and buffers the fourth inverted internal data IDB<4> and generates the fourth chop signal QBCH since the fourth delayed clock DCLK<4> is the logic high level. At this time, the fourth chop signal QBCH is generated from the fourth global data GIO<4>.

In the read operation during a period T26 to T28, the second buffer circuit 612 of the first pre-signal generation circuit 610 inverts and buffers the first inverted internal data IDB<1> and generates the first chop signal ICH since the first delayed clock DCLK<1> is the logic high level. At this time, the first chop signal ICH is generated from the fifth global data GIO<5>.

In the read operation during a period T27 to T29, the eighth buffer circuit 632 of the third pre-signal generation circuit 630 inverts and buffers the second inverted internal data IDB<2> and generates the third chop signal QCH since the second delayed clock DCLK<2> is the logic high level. At this time, the third chop signal QCH is generated from the sixth global data GIO<6>.

In the read operation during a period T28 to T30, the fifth buffer circuit 622 of the second pre-signal generation circuit 620 inverts and buffers the third inverted internal data IDB<3> and generates the second chop signal IBCH since the third delayed clock DCLK<3> is the logic high level. At this time, the second chop signal IBCH is generated from the seventh global data GIO<7>.

In the read operation during a period T29 to T31, the eleventh buffer circuit 642 of the fourth pre-signal generation circuit 640 inverts and buffers the fourth inverted internal data IDB<4> and generates the fourth chop signal QBCH since the fourth delayed clock DCLK<4> is the logic high level. At this time, the fourth chop signal QBCH is generated from the eighth global data GIO<8>.

In succession, an operation of generating the first to fourth pre-signals PRE<1:4> in synchronization with the first to fourth delayed clocks DCLK<1:4> in the pre-signal generation circuit 550 in the read operation after the initializing operation will be described below.

During a period T22 to T23, the third buffer circuit 613 of the first pre-signal generation circuit 610 buffers the first chop signal ICH and drives the first pre-signal PRE<1> since the second delayed clock DCLK<2> is the logic low level. At this time, the first pre-signal PRE<1> is generated from the first global data GIO<1>.

During a period T23 to T24, the ninth buffer circuit 633 of the third pre-signal generation circuit 630 buffers the third chop signal QCH and drives the third pre-signal PRE<3> since the third delayed clock DCLK<3> is the logic low level. At this time, the third pre-signal PRE<3> is generated from the second global data GIO<2>.

During a period T24 to T25, the sixth buffer circuit 623 of the second pre-signal generation circuit 620 buffers the second chop signal IBCH and drives the second pre-signal PRE<2> since the fourth delayed clock DCLK<4> is the logic low level. At this time, the second pre-signal PRE<2> is generated from the third global data GIO<3>.

During a period T25 to T26, the twelfth buffer circuit 643 of the fourth pre-signal generation circuit 640 buffers the fourth chop signal QBCH and drives the fourth pre-signal PRE<4> since the first delayed clock DCLK<1> is the logic low level. At this time, the fourth pre-signal PRE<4> is generated from the fourth global data GIO<4>.

During a period T26 to T27, the third buffer circuit 613 of the first pre-signal generation circuit 610 buffers the first chop signal ICH and drives the first pre-signal PRE<1> since the second delayed clock DCLK<2> is the logic low level. At this time, the first pre-signal PRE<1> is generated from the fifth global data GIO<5>.

During a period T27 to T28, the ninth buffer circuit 633 of the third pre-signal generation circuit 630 buffers the third chop signal QCH and drives the third pre-signal PRE<3> since the third delayed clock DCLK<3> is the logic low level. At this time, the third pre-signal PRE<3> is generated from the sixth global data GIO<6>.

During a period T28 to T29, the sixth buffer circuit 623 of the second pre-signal generation circuit 620 buffers the second chop signal IBCH and drives the second pre-signal PRE<2> since the fourth delayed clock DCLK<4> is the logic low level. At this time, the second pre-signal PRE<2> is generated from the seventh global data GIO<7>.

During a period T29 to T30, the twelfth buffer circuit 643 of the fourth pre-signal generation circuit 640 buffers the fourth chop signal QBCH and drives the fourth pre-signal PRE<4> since the first delayed clock DCLK<1> is the logic low level. At this time, the fourth pre-signal PRE<4> is generated from the eighth global data GIO<8>.

Then, an operation of summing the first to fourth pre-signals PRE<1:4> and thereby generating the first and second summed signals SUM<1:2> in the signal summing circuit 560 in the read operation after the initializing operation will be described below.

During the period T22 to T23, the first signal summing circuit 650 of the signal summing circuit 560 sums the first pre-signal PRE<1> and the second pre-signal PRE<2> and drives the first summed signal SUM<1>. At this time, the first summed signal SUM<1> is generated from the first global data GIO<1>.

During the period T23 to T24, the second signal summing circuit 660 of the signal summing circuit 560 sums the third pre-signal PRE<3> and the fourth pre-signal PRE<4> and drives the second summed signal SUM<2>. At this time, the second summed signal SUM<2> is generated from the second global data GIO<2>.

During the period T24 to T25, the first signal summing circuit 650 of the signal summing circuit 560 sums the first pre-signal PRE<1> and the second pre-signal PRE<2> and drives the first summed signal SUM<1>. At this time, the first summed signal SUM<1> is generated from the third global data GIO<3>.

During the period T25 to T26, the second signal summing circuit 660 of the signal summing circuit 560 sums the third pre-signal PRE<3> and the fourth pre-signal PRE<4> and drives the second summed signal SUM<2>. At this time, the second summed signal SUM<2> is generated from the fourth global data GIO<4>.

During the period T26 to T27, the first signal summing circuit 650 of the signal summing circuit 560 sums the first pre-signal PRE<1> and the second pre-signal PRE<2> and drives the first summed signal SUM<1>. At this time, the first summed signal SUM<1> is generated from the fifth global data GIO<5>.

During the period T27 to T28, the second signal summing circuit 660 of the signal summing circuit 560 sums the third pre-signal PRE<3> and the fourth pre-signal PRE<4> and drives the second summed signal SUM<2>. At this time, the second summed signal SUM<2> is generated from the sixth global data GIO<6>.

During the period T28 to T29, the first signal summing circuit 650 of the signal summing circuit 560 sums the first pre-signal PRE<1> and the second pre-signal PRE<2> and drives the first summed signal SUM<1>. At this time, the first summed signal SUM<1> is generated from the seventh global data GIO<7>.

During the period T29 to T30, the second signal summing circuit 660 of the signal summing circuit 560 sums the third pre-signal PRE<3> and the fourth pre-signal PRE<4> and drives the second summed signal SUM<2>. At this time, the second summed signal SUM<2> is generated from the eighth global data GIO<8>.

Thereafter, an operation of summing the first and second summed signals SUM<1:2> and thereby generating the driving signal DRV in the signal summing circuit 560 in the read operation after the initializing operation will be described below.

During the period T22 to T23, the third signal summing circuit 670 of the signal summing circuit 560 sums the first summed signal SUM<1> and the second summed signal SUM<2> and drives the driving signal DRV. At this time, the driving signal DRV is generated from the first global data GIO<1>.

During the period T23 to T24, the third signal summing circuit 670 of the signal summing circuit 560 sums the first summed signal SUM<1> and the second summed signal SUM<2> and drives the driving signal DRV. At this time, the driving signal DRV is generated from the second global data GIO<2>.

During the period T24 to T25, the third signal summing circuit 670 of the signal summing circuit 560 sums the first summed signal SUM<1> and the second summed signal SUM<2> and drives the driving signal DRV. At this time, the driving signal DRV is generated from the third global data GIO<3>.

During the period T25 to T26, the third signal summing circuit 670 of the signal summing circuit 560 sums the first summed signal SUM<1> and the second summed signal SUM<2> and drives the driving signal DRV. At this time, the driving signal DRV is generated from the fourth global data GIO<4>.

During the period T26 to T27, the third signal summing circuit 670 of the signal summing circuit 560 sums the first summed signal SUM<1> and the second summed signal SUM<2> and drives the driving signal DRV. At this time, the driving signal DRV is generated from the fifth global data GIO<5>.

During the period T27 to T28, the third signal summing circuit 670 of the signal summing circuit 560 sums the first summed signal SUM<1> and the second summed signal SUM<2> and drives the driving signal DRV. At this time, the driving signal DRV is generated from the sixth global data GIO<6>.

During the period T28 to T29, the third signal summing circuit 670 of the signal summing circuit 560 sums the first summed signal SUM<1> and the second summed signal SUM<2> and drives the driving signal DRV. At this time, the driving signal DRV is generated from the seventh global data GIO<7>.

During the period T29 to T30, the third signal summing circuit 670 of the signal summing circuit 560 sums the first summed signal SUM<1> and the second summed signal SUM<2> and drives the driving signal DRV. At this time, the driving signal DRV is generated from the eighth global data GIO<8>.

As is apparent from the above descriptions, in the semiconductor device according to an embodiment, output data is outputted in synchronization with divided clocks having different phases and is driven to a fixed logic level during a period excluding a data output period, whereby it is possible to prevent an output data generation error from occurring, even though a divided clock is generated.

Figure 9:
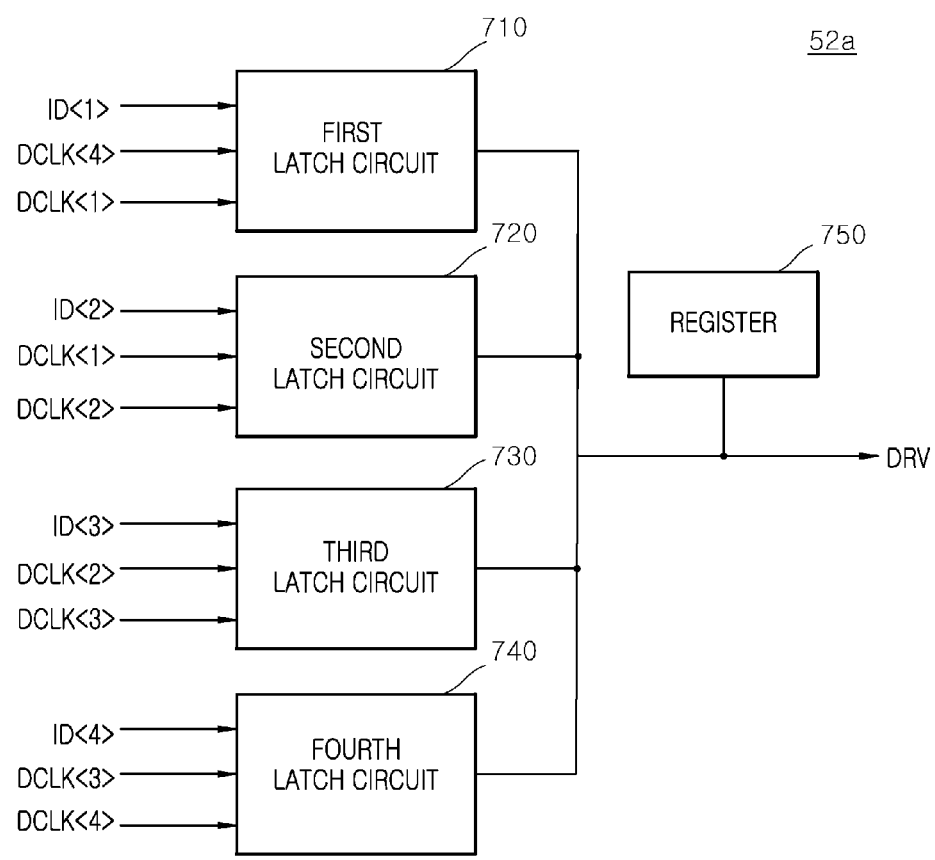
FIG. 9 is a block diagram illustrating a representation of other examples of the configuration of the driving signal generation circuit included in the trigger circuit illustrated in FIG. 7.

Referring to FIG. 9, a driving signal generation circuit 52a in accordance with other embodiments may include a first latch circuit 710, a second latch circuit 720, a third latch circuit 730, a fourth latch circuit 740 and a register 750.

The first latch circuit 710 may drive the driving signal DRV depending on the logic level of the first internal data ID<1>, during a period in which the fourth delayed clock DCLK<4> and the first delayed clock DCLK<1> are logic high levels.

The second latch circuit 720 may drive the driving signal DRV depending on the logic level of the second internal data ID<2>, during a period in which the first delayed clock DCLK<1> and the second delayed clock DCLK<2> are logic high levels.

The third latch circuit 730 may drive the driving signal DRV depending on the logic level of the third internal data ID<3>, during a period in which the second delayed clock DCLK<2> and the third delayed clock DCLK<3> are logic high levels.

The fourth latch circuit 740 may drive the driving signal DRV depending on the logic level of the fourth internal data ID<4>, during a period in which the third delayed clock DCLK<3> and the fourth delayed clock DCLK<4> are logic high levels. The first latch circuit 710, the second latch circuit 720, the third latch circuit 730 and the fourth latch circuit 740 may be realized by cross-coupled latches.

The register 750 may store the driving signal DRV.

Figure 10:
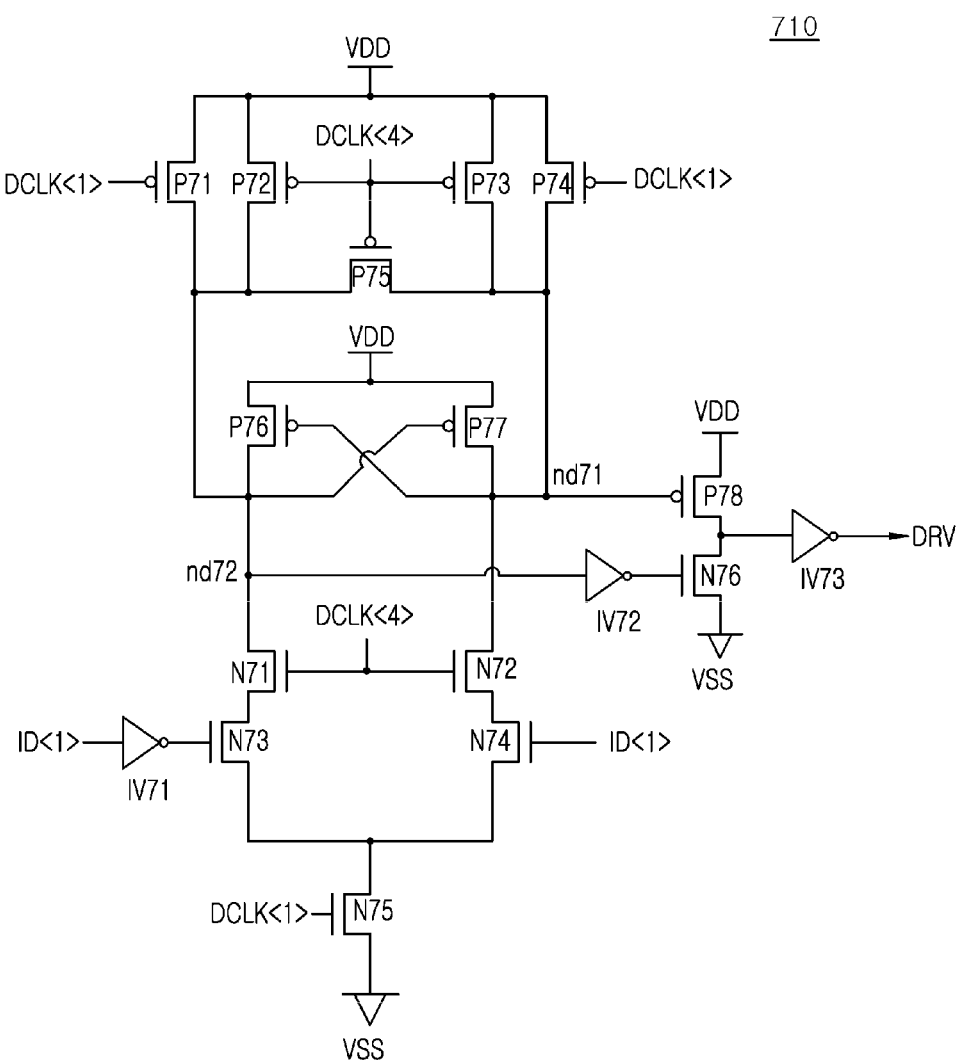
FIG. 10 is a circuit diagram illustrating a representation of an example of the configuration of the first latch circuit included in the driving signal generation circuit illustrated in FIG. 9.

Referring to FIG. 10, the first latch circuit 710 may be realized by a plurality of PMOS transistors P71, P72, P73, P74, P75, P76, P77 and P78, a plurality of NMOS transistors N71, N72, N73, N74, N75 and N76 and a plurality of inverters IV71, IV72 and IV73. The first latch circuit 710 may be realized by a cross-coupled latch. Furthermore, the configuration of a transistor, for the transistors P71 to P78 and N71 to N76, required for implementing the same function or operation may be modified differently from, for example, what is illustrated in FIG. 10. That is, the configuration of the PMOS transistor and the configuration of the NMOS transistor may be replaced with each other, depending on a specific situation. If necessary, various transistors may be applied to implement the configurations.

The first latch circuit 710 may drive nodes nd71 and nd72 to the level of a power supply voltage VDD as the PMOS transistors P71, P72, P73, P74 and P75 are turned on during a period in which the fourth delayed clock DCLK<4> and the first delayed clock DCLK<1> are logic low levels. The period in which the fourth delayed clock DCLK<4> and the first delayed clock DCLK<1> are logic low levels may be set as a precharge period.

In the first latch circuit 710, the NMOS transistors N71, N72 and N75 are turned on during a period in which the fourth delayed clock DCLK<4> and the first delayed clock DCLK<1> are the logic high levels, and the charges of the nodes nd71 and nd72 are discharged to a ground voltage VSS depending on the logic level of the first internal data ID<1>.

The first latch circuit 710 may drive the driving signal DRV as the PMOS transistor P78 and the NMOS transistor N76 are selectively driven depending on the logic levels of the nodes nd71 and nd72.

The first latch circuit 710 as mentioned above may perform a precharge operation during the period in which the fourth delayed clock DCLK<4> and the first delayed clock DCLK<1> are the logic low levels. The first latch circuit 710 may drive the driving signal DRV depending on the logic level of the first internal data ID<1>, during the period in which the fourth delayed clock DCLK<4> and the first delayed clock DCLK<1> are the logic high levels.

The semiconductor devices described above with reference to FIGS. 1 to 10 may be applied to an electronic system which includes a memory system, a graphic system, a computing system or a mobile system. For example, referring to FIG. 11, an electronic system 1000 in accordance with an embodiment may include a data storage 1001, a memory controller 1002, a buffer memory 1003, and an input/output interface 1004.

The data storage 1001 stores data applied from the memory controller 1002, and reads out stored data and outputs the read-out data to the memory controller 1002, according to control signals from the memory controller 1002. The data storage 1001 may include the semiconductor devices illustrated in FIG. 1. The data storage 1001 may include a nonvolatile memory capable of not losing and continuously storing data even though power supply is interrupted. A nonvolatile memory may be realized as a flash memory such as a NOR flash memory and a NAND flash memory, a phase change random access memory (PRAM), a resistive random access memory (RRAM), a spin transfer torque random access memory (STTRAM) or a magnetic random access memory (MRAM).

The memory controller 1002 decodes commands applied through the input/output interface 1004 from an external device (a host), and controls input/output of data with respect to the data storage 1001 and the buffer memory 1003 according to decoding results. While the memory controller 1002 is illustrated as one block in FIG. 11, it is to be noted that, in the memory controller 1002, a controller for controlling a nonvolatile memory and a controller for controlling the buffer memory 1003 as a volatile memory may be independently configured.

The buffer memory 1003 may temporarily store data to be processed in the memory controller 1002, that is, data to be inputted and outputted to and from the data storage 1001. The buffer memory 1003 may store data applied from the memory controller 1002 according to a control signal. The buffer memory 1003 reads out stored data and outputs the read-out data to the memory controller 1002. The buffer memory 1003 may include a volatile memory such as a DRAM (dynamic random access memory), a mobile DRAM and an SRAM (static random access memory).

The input/output interface 1004 provides a physical coupling between the memory controller 1002 and the external device (the host) such that the memory controller 1002 may receive control signals for input/output of data from the external device and exchange data with the external device. The input/output interface 1004 may include one among various interface protocols such as USB, MMC, PCI-E, SAS, SATA, PATA, SCSI, ESDI and IDE.

The electronic system 1000 may be used as an auxiliary memory device or an external storage device of the host. The electronic system 1000 may include a solid state disk (SSD), a USB memory (universal serial bus memory), a secure digital (SD) card, a mini-secure digital (mSD) card, a micro SD card, a secure digital high capacity (SDHC) card, a memory stick card, a smart media (SM) card, a multimedia card (MMC), an embedded MMC (eMMC), or a compact flash (CF) card.

While various embodiments have been described above, it will be understood to those skilled in the art that the embodiments described are by way of example only. Accordingly, the semiconductor devices described herein should not be limited based on the described embodiments.

What is claimed is:

1. A semiconductor device comprising:
 a control circuit configured to generate a data reset signal which is enabled in response to a reset signal and first and second transfer control signals which are sequentially enabled in synchronization with a divided clock in response to a read signal; and
 a trigger circuit configured to drive a driving signal depending on a logic level of latch data in synchronization with delayed clocks in response to the first and second transfer control signals, the driving signal having a fixed logic level based on the data reset signal being enabled.

2. The semiconductor device according to claim 1,
 wherein the delayed clocks comprise first and second delayed clocks, and
 wherein the driving signal is driven depending on the logic level of the latch data in synchronization with rising edges of the first and second delayed clocks.

3. The semiconductor device according to claim 1,
 wherein the delayed clocks comprise first and second delayed clocks, and
 wherein the driving signal has the fixed logic level regardless of the first and second delayed clocks and the logic level of the latch data based on the data reset signal being enabled.

4. The semiconductor device according to claim 1, wherein the control circuit comprises:
 a first flip-flop configured to latch the read signal in synchronization with a rising edge of the divided clock and output the latched read signal as the first transfer control signal;
 a second flip-flop configured to latch the first transfer control signal in synchronization with a rising edge of the divided clock and output the latched first transfer control signal as the second transfer control signal;
 a third flip-flop configured to latch the second transfer control signal in synchronization with a rising edge of the divided clock and output the latched second transfer control signal as an internal transfer control signal; and
 a data reset signal generation circuit configured to generate the data reset signal which is enabled in response to the reset signal or the internal transfer control signal, and generate the data reset signal which is disabled, by blocking input of the internal transfer control signal based on the first transfer control signal being a first logic level in response to the divided clock in a successive read operation.

5. The semiconductor device according to claim 1,
 wherein the delayed clocks comprise first and second delayed clocks, and wherein the trigger circuit comprises:
an internal data generation circuit configured to generate internal data having the fixed logic level in response to the data reset signal, and generate the internal data by buffering the latch data in response to the first and second transfer control signals; and
a driving signal generation circuit configured to generate the driving signal depending on a logic level of the internal data in synchronization with the first and second delayed clocks.

6. The semiconductor device according to claim 5, wherein the driving signal generation circuit comprises:
a pre-signal generation circuit configured to generate pre-signals from the internal data in synchronization with the delayed clocks; and
a signal summing circuit configured to sum the pre-signals and generate the driving signal.

7. The semiconductor device according to claim 5, wherein the driving signal generation circuit comprises:
a latch circuit configured to drive the driving signal depending on the logic level of the internal data during a period based on logic levels of the first and second delayed clocks, and
a register configured to store the driving signal.

8. The semiconductor device according to claim 5, wherein the internal data generation circuit comprises:
a selective transfer circuit configured to output a first bit included in the latch data as selection data in response to the first transfer control signal, and output a second bit included in the latch data as the selection data in response to the second transfer control signal; and
a logic circuit configured to generate the internal data having the fixed logic level based on the data reset signal being enabled, and generate the internal data by buffering the selection data based on the data reset signal being disabled.

9. A semiconductor device comprising:
a control circuit configured to generate first to fourth data reset signals which are enabled in response to a reset signal and first to eighth transfer control signals which are sequentially enabled in synchronization with first to fourth divided clocks in response to a read signal;
a pipe latch circuit configured to latch first to eighth global data in response to first to fourth input control signals, and generate first to fourth latch data from the latched first to eighth global data in response to first to fourth output control signals; and
a trigger circuit configured to drive a driving signal depending on logic levels of the first to fourth latch data in synchronization with first to fourth delayed clocks in response to the first to eighth transfer control signals, the driving signal having a fixed logic level based on the first to fourth data reset signals being enabled.

10. The semiconductor device according to claim 9, wherein the first to fourth divided clocks have different phases, and the first to fourth delayed clocks are generated as the first to fourth divided clocks are delayed by a predetermined period.

11. The semiconductor device according to claim 9, wherein the driving signal is driven depending on the logic levels of the first to fourth latch data in synchronization with rising edges of the first to fourth delayed clocks.

12. The semiconductor device according to claim 9, wherein the driving signal has the fixed logic level regardless of the first to fourth delayed clocks and the logic levels of the first to fourth latch data based on the first to fourth data reset signals being enabled.

13. The semiconductor device according to claim 9, wherein the first latch data is generated from the first and fifth global data, the second latch data is generated from the second and sixth global data, the third latch data is generated from the third and seventh global data, and the fourth latch data is generated from the fourth and eighth global data.

14. The semiconductor device according to claim 9, wherein the control circuit comprises:
a first control circuit configured to generate the first data reset signal which is enabled in response to the reset signal and the first and second transfer control signals which are sequentially enabled in synchronization with the second divided clock in response to the read signal;
a second control circuit configured to generate the second data reset signal which is enabled in response to the reset signal and the third and fourth transfer control signals which are sequentially enabled in synchronization with the third divided clock in response to the read signal;
a third control circuit configured to generate the third data reset signal which is enabled in response to the reset signal and the fifth and sixth transfer control signals which are sequentially enabled in synchronization with the fourth divided clock in response to the read signal; and
a fourth control circuit configured to generate the fourth data reset signal which is enabled in response to the reset signal and the seventh and eighth transfer control signals which are sequentially enabled in synchronization with the first divided clock in response to the read signal.

15. The semiconductor device according to claim 9, wherein the trigger circuit comprises:
an internal data generation circuit configured to generate first to fourth internal data which have the fixed logic level, in response to the first to fourth data reset signals, and generate the first to fourth internal data by buffering the first to fourth latch data in response to the first to eighth transfer control signals; and
a driving signal generation circuit configured to generate the driving signal depending on logic levels of the first to fourth internal data in synchronization with the first to fourth delayed clocks.

16. The semiconductor device according to claim 15, wherein the internal data generation circuit comprises:
a first internal data generation circuit configured to generate the first internal data which has the fixed logic level, in response to the first data reset signal, and generate the first internal data by buffering the first latch data in response to the first and second transfer control signals;
a second internal data generation circuit configured to generate the second internal data which has the fixed logic level, in response to the second data reset signal, and generate the second internal data by buffering the second latch data in response to the third and fourth transfer control signals;
a third internal data generation circuit configured to generate the third internal data which has the fixed logic level, in response to the third data reset signal, and generate the third internal data by buffering the third latch data in response to the fifth and sixth transfer control signals; and
a fourth internal data generation circuit configured to generate the fourth internal data which has the fixed logic level, in response to the fourth data reset signal, and generate the fourth internal data by buffering the fourth latch data in response to the seventh and eighth transfer control signals.

17. The semiconductor device according to claim 15, wherein the driving signal generation circuit comprises:
a pre-signal generation circuit configured to generate first to fourth pre-signals from the first to fourth internal data in synchronization with the first to fourth delayed clocks; and
a signal summing circuit configured to sum the first to fourth pre-signals and generate the driving signal.

18. The semiconductor device according to claim 17, wherein the pre-signal generation circuit comprises:
a first pre-signal generation circuit configured to generate the first pre-signal which is driven depending on the logic level of the first internal data during a period in which the first delayed clock is a first logic level and the second delayed clock is a second logic level;
a second pre-signal generation circuit configured to generate the second pre-signal which is driven depending on the logic level of the third internal data during a period in which the third delayed clock is the first logic level and the fourth delayed clock is the second logic level;
a third pre-signal generation circuit configured to generate the third pre-signal which is driven depending on the logic level of the second internal data during a period in which the second delayed clock is the first logic level and the third delayed clock is the second logic level; and
a fourth pre-signal generation circuit configured to generate the fourth pre-signal which is driven depending on the logic level of the fourth internal data during a period in which the fourth delayed clock is the first logic level and the first delayed clock is the second logic level.

19. The semiconductor device according to claim 17, wherein the signal summing circuit comprises:
a first signal summing circuit configured to perform an AND logic operation on the first pre-signal and the second pre-signal and generate a first summed signal;
a second signal summing circuit configured to perform an AND logic operation on the third pre-signal and the fourth pre-signal and generate a second summed signal; and
a third signal summing circuit configured to perform an AND logic operation on the first summed signal and the second summed signal and generate the driving signal.

20. The semiconductor device according to claim 15, wherein the driving signal generation circuit comprises:
a first latch circuit configured to drive the driving signal depending on the logic level of the first internal data during a period in which the fourth delayed clock and the first delayed clock are a first logic level;
a second latch circuit configured to drive the driving signal depending on the logic level of the second internal data during a period in which the first delayed clock and the second delayed clock are the first logic level;
a third latch circuit configured to drive the driving signal depending on the logic level of the third internal data during a period in which the second delayed clock and the third delayed clock are the first logic level;
a fourth latch circuit configured to drive the driving signal depending on the logic level of the fourth internal data during a period in which the third delayed clock and the fourth delayed clock are the first logic level; and
a register configured to store the driving signal.

21. The semiconductor device according to claim 9, further comprising:
a frequency dividing circuit configured to generate the first to fourth divided clocks which have different phases, in response to a clock inputted from an outside;
a repeater configured to delay the first to fourth divided clocks by a predetermined period and generate the first to fourth delayed clocks; and
a data output circuit configured to drive output data depending on a logic level of the driving signal, and output the output data to an outside.

22. The semiconductor device according to claim 21, wherein a frequency of the first to fourth divided clocks and the first to fourth delayed clocks is set to a frequency that is two times higher than a frequency of the clock.

\* \* \* \* \*